United States Patent
Haringer et al.

(10) Patent No.: US 10,443,148 B2
(45) Date of Patent: *Oct. 15, 2019

(54) METHODS FOR CONTROLLED DOPING OF A MELT INCLUDING INTRODUCING LIQUID DOPANT BELOW A SURFACE OF THE MELT

(71) Applicant: GlobalWafers Co., Ltd., Hsinchu (TW)

(72) Inventors: Stephan Haringer, Kastelbell-Tschars (IT); Marco D'Angella, Merano (IT); Mauro Diodà, Bolzano (IT)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/556,865

(22) PCT Filed: Mar. 10, 2016

(86) PCT No.: PCT/IB2016/051357
§ 371 (c)(1),
(2) Date: Sep. 8, 2017

(87) PCT Pub. No.: WO2016/142893
PCT Pub. Date: Sep. 15, 2016

(65) Prior Publication Data
US 2018/0044814 A1    Feb. 15, 2018

Related U.S. Application Data

(60) Provisional application No. 62/130,692, filed on Mar. 10, 2015.

(51) Int. Cl.
*C30B 15/04*    (2006.01)
*C30B 29/06*    (2006.01)

(52) U.S. Cl.
CPC ............. *C30B 15/04* (2013.01); *C30B 29/06* (2013.01)

(58) Field of Classification Search
CPC ......... C30B 15/00; C30B 15/02; C30B 15/04; C30B 15/20; C30B 29/00; C30B 29/02; C30B 29/06; C30B 31/00; C30B 31/04
(Continued)

(56) References Cited

U.S. PATENT DOCUMENTS 5,242,531 A * 9/1993 Klingshirn .............. C30B 15/02
                                                          117/21
10,023,973 B2 * 7/2018 Dell'Amico ............ C30B 15/02
(Continued)

FOREIGN PATENT DOCUMENTS

DE         1291322 B      3/1969
JP    2005336020 A  * 12/2005
(Continued)

OTHER PUBLICATIONS

International Search Report and Written Opinion of the International Searching Authority regarding PCT/IB2016/051357 dated Jul. 15, 2016, 12 pgs.

*Primary Examiner* — Kenneth A Bratland, Jr.
(74) *Attorney, Agent, or Firm* — Armstrong Teasdale LLP

(57) ABSTRACT

A method of growing a doped monocrystalline ingot using a crystal growing system is provided. The crystal growing system includes a growth chamber, a dopant feeding device, and a feed tube. The method includes preparing a melt of semiconductor or solar-grade material in a crucible disposed within the growth chamber, introducing a solid dopant into the feed tube with the dopant feeding device, melting the solid dopant within the feed tube to a form a liquid dopant, introducing the liquid dopant into the melt below a surface of the melt, and growing a monocrystalline ingot from the melt by contacting the melt with a seed crystal and pulling the seed crystal away from the melt.

11 Claims, 4 Drawing Sheets

(58) Field of Classification Search
USPC ..... 117/13, 19, 21, 200, 206, 208, 214, 912, 117/928, 931–932
See application file for complete search history.

(56) References Cited

U.S. PATENT DOCUMENTS

2003/0061985 A1* 4/2003 Kulkarni ................ C30B 15/04
117/19
2010/0151667 A1* 6/2010 Narushima ............. C30B 15/04
438/510

FOREIGN PATENT DOCUMENTS

| | | |
|---|---|---|
| JP | 2005336020 A | 12/2005 |
| JP | 2010070404 A | 4/2010 |
| WO | 0186033 A1 | 11/2001 |
| WO | 2014102387 A1 | 7/2014 |
| WO | 2014141309 A1 | 9/2014 |
| WO | 2014195980 A1 | 12/2014 |

* cited by examiner

METHODS FOR CONTROLLED DOPING OF A MELT INCLUDING INTRODUCING LIQUID DOPANT BELOW A SURFACE OF THE MELT

CROSS-REFERENCE TO RELATED APPLICATIONS

This application is a National Stage application of International Application No. PCT/IB2016/051357, filed on Mar. 10, 2016, which claims priority to U.S. Provisional Patent Application Ser. No. 62/130,692, filed Mar. 10, 2015, the disclosures of which are hereby incorporated by reference in their entirety.

FIELD

The field relates generally to preparation of single crystals of semiconductor or solar-grade material and, more specifically, to a liquid doping system for controlled doping of a melt of semiconductor or solar-grade material.

BACKGROUND

Single crystal material, which is the starting material for fabricating many electronic components such as semiconductor devices and solar cells, is commonly prepared using the Czochralski ("CZ") method. Briefly, the Czochralski method involves melting polycrystalline source material, such as polycrystalline silicon ("poly silicon"), in a crucible to form a silicon melt and then pulling a single-crystal ingot from the melt.

During the process, dopants are added to the molten source material to modify the base resistivity of the resulting monocrystalline structure. Dopants are often added to the molten source material in solid form, at least for p-type and n-type silicon. However, the use of solid dopants presents several drawbacks.

One drawback is a thermal shock resulting from the temperature difference between solid dopants and the molten source material. This thermal shock causes the molten source material to solidify underneath the solid dopant granules, creating "floating boats". Additionally, quartz particles can form during the formation of the floating boats. These quartz particles may remain in the molten source material long after the floating boats have melted, resulting in crystal defects or loss of crystal structure.

A further drawback resulting from the addition of solid dopants to the molten source material is contamination of the monocrystalline growing assembly. The impact of solid dopants on the surface of the molten source material causes the molten source material to splash out of the crucible and onto various components of the monocrystalline growing assembly, which may result in crystal defects or damage to components in the assembly.

Yet another drawback to using solid dopants is that many have relatively high evaporation rates, such as indium or antimony. Placing these dopants directly into the crucible with the semiconductor or other solar-grade material prior to melting causes the dopant to evaporate during the heating of the semiconductor or solar-grade material. Additional dopant must be added to compensate for the lost dopant, often in significant quantities, resulting in an inefficient use of the dopant. Additionally, the evaporated dopant condenses on various components of the growing assembly, resulting in contamination of the assembly. Moreover, when low temperature or volatile dopants are added to a melt, they often remain on the surface of the melt even after the dopants are melted. As a result, there is often a continuous liquid-gas interface through which the dopant can readily evaporate.

Accordingly, a need exists for more satisfactory systems and methods for introducing dopants into a melt of semiconductor or solar-grade material.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a method of growing a doped monocrystalline ingot using a crystal growing system is provided. The crystal growing system includes a growth chamber, a dopant feeding device, and a feed tube. The method includes preparing a melt of semiconductor or solar-grade material in a crucible disposed within the growth chamber, introducing a solid dopant into the feed tube with the dopant feeding device, melting the solid dopant within the feed tube to a form a liquid dopant, introducing the liquid dopant into the melt below a surface of the melt, and growing a monocrystalline ingot from the melt by contacting the melt with a seed crystal and pulling the seed crystal away from the melt.

In another aspect, a method of introducing a dopant into a melt of semiconductor or solar-grade material using a feed tube and a dopant feeding device is provided. The method includes introducing a solid dopant into the feed tube with the dopant feeding device, melting the solid dopant within the feed tube to a form a liquid dopant, and introducing the liquid dopant into the melt below a surface of the melt.

In yet another aspect, a system for growing a single crystal ingot from a melt of semiconductor or solar-grade material is provided. The system includes a housing defining a crystal growth chamber, a crucible disposed within the growth chamber for holding a melt of semiconductor or solar-grade material, a dopant feeding device configured to dispense solid dopant, and a feed tube. The feed tube is configured to receive solid dopant from the dopant feeding device and dispense liquid dopant into the melt. The feed tube defines a dopant outlet, and includes a restrictor nozzle configured to inhibit solid dopant from passing through the dopant outlet and to allow liquid dopant to pass through the dopant outlet.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
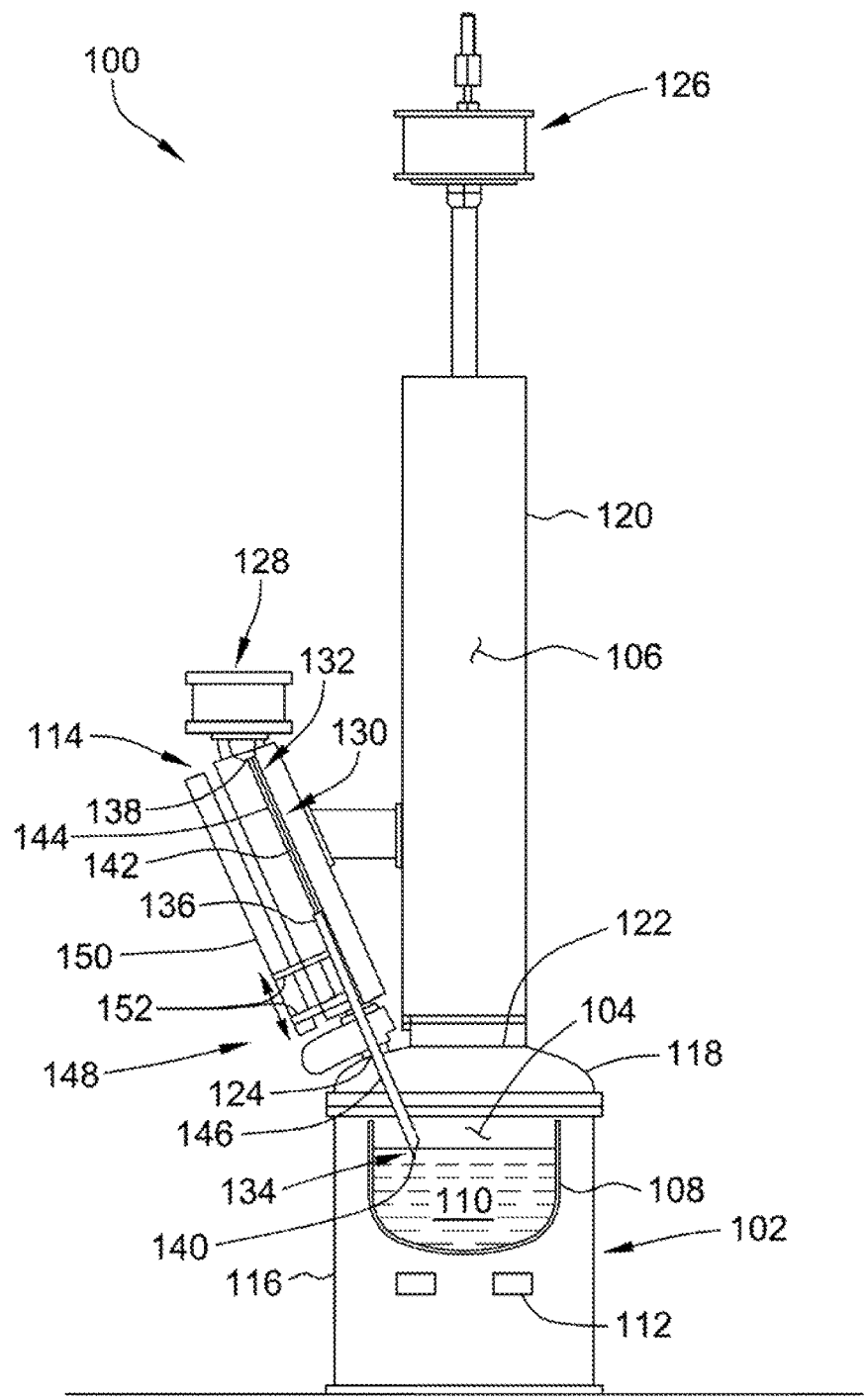
FIG. 1 is a cross-section of a crystal growing system including an example doping system for introducing liquid dopant into a melt.

Referring to FIG. 1, a crystal growing system is shown schematically and is indicated generally at 100 in FIG. 1. The crystal growing system 100 is used to produce monocrystalline (i.e., single crystal) ingots of semiconductor or solar-grade material (e.g., silicon) by the Czochralski (CZ) method. Although the crystal growing system 100 is described herein with reference to a batch or recharge CZ method, the crystal growing system 100 may also be used to grow monocrystalline ingots by a continuous CZ method.

The illustrated crystal growing system 100 generally includes a housing 102 defining a growth chamber 104 and an ingot removal chamber 106 connected to and positioned above the growth chamber 104. A crucible 108 containing a melt 110 of semiconductor or solar-grade material (e.g., silicon) is positioned within the growth chamber 104, and one or more heating elements 112 are positioned proximate the crucible 108 for supplying thermal energy to the system 100. The crystal growing system 100 also includes an automatic doping system 114 connected to the housing 102 for introducing dopant into the melt 110.

The housing 102 includes a lower portion 116, an upper dome 118 connected to the lower portion 116, and an elongate tubular portion 120 extending generally upward from the upper dome 118. In the illustrated embodiment, the growth chamber 104 is defined by the lower portion 116 and the upper dome 118, and the ingot removal chamber 106 is generally defined by the elongate tubular portion 120. The upper dome 118 includes a central annular opening 122 providing communication between the growth chamber 104 and the removal chamber 106, and a feed port 124 (broadly, an opening) through which dopants may be introduced into the melt 110. In the illustrated embodiment, the feed port 124 is defined along the upper dome 118, although the feed port 124 may be located along any suitable portion of the housing 102 that enables the doping system 114 to function as described herein.

The housing 102 may be made of stainless steel or other suitable materials. In some embodiments, one or more of the lower portion 116, the upper dome 118, and the tubular portion 120 may include water-cooled stainless steel walls.

The crucible 108 is positioned within the growth chamber 104 and beneath the removal chamber 106 such that an ingot grown from the melt 110 can be pulled by a crystal pulling mechanism 126 through the central opening 122 in the upper dome 118 and into the removal chamber 106. The crucible 108 may be supported within the growth chamber 104 by a susceptor (not shown) and a rotatable shaft (not shown) configured to rotate the crucible 108 during growth of a crystal ingot.

The crucible 108 may be made of, for example, quartz or any other suitable material that enables the crystal growing system 100 to function as described herein. Further, the crucible 108 may have any suitable size that enables the crystal growing system 100 to function as described herein. In some embodiments, the crucible 108 has a diameter of between about 16 inches and about 32 inches, more suitably between about 20 inches and about 28 inches, and even more suitably between about 20 inches and about 24 inches. In other embodiments, the crucible 108 may have a diameter less than about 16 inches or greater than about 32 inches.

The doping system 114 generally includes a dopant feeding device 128 and a feed tube 130. The dopant feeding device 128 is secured to the housing 102, and is positioned outside of the growth chamber 104. The feed tube 130 is positioned proximate an outlet of the dopant feeding device 128, and extends through the feed port 124 of the housing 102 and into the growth chamber 104. The dopant feeding device 128 is configured to dispense solid dopant into the feed tube 130, and the feed tube 130 is configured to retain solid dopant therein until the dopant is melted, and to introduce liquid dopant into the melt 110.

Figure 2:
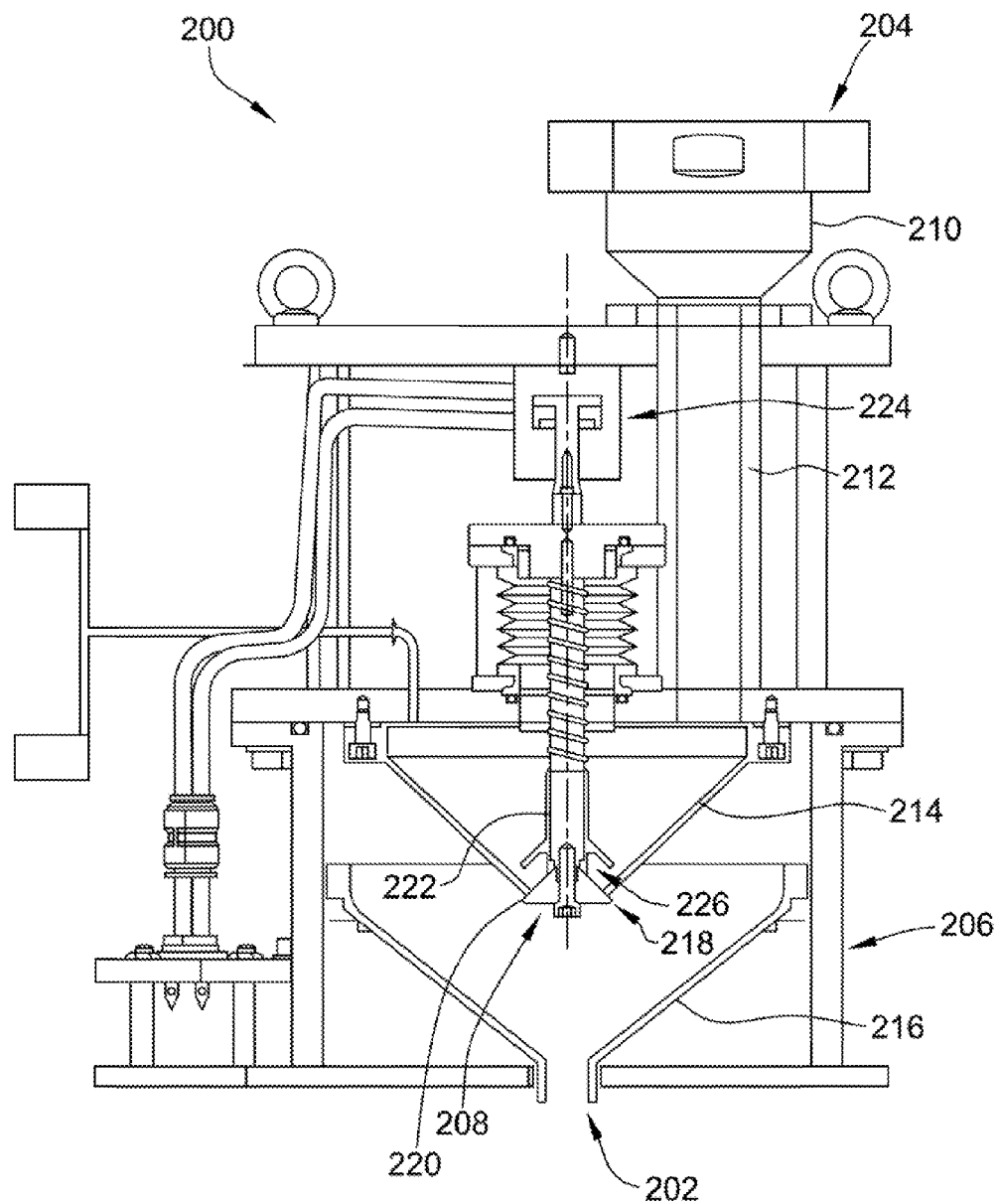
FIG. 2 is a cross-section of a dopant feeding device suitable for use with the doping system of FIG. 1.

FIG. 2 is a cross section of an example dopant feeding device 200 suitable for use with the doping system 114 of FIG. 1. The example dopant feeding device 200 is configured to dispense metered quantities of solid dopant through an outlet 202 defined at the lowermost point of the dopant feeding device 200. The dopant feeding device 200 generally includes a fill assembly 204, a hopper 206, and a double valve system 208.

The fill assembly 204 includes a fill port 210 and a feed tube 212 connected to the fill port 210 and extending from the fill port 210 into the hopper 206. To load dopant into the dopant feeding device 200, dopant is fed into the fill port 210 and is funneled down into the feed tube 212 and into the hopper 206.

The hopper 206 includes a dopant container 214 for storing dopant, and a dopant funnel 216 connected to a lower opening 218 of the dopant container 214. Dopant fed into the fill port 210 is directed into the dopant container 214 by the feed tube 212. Dopant is stored in the dopant container 214, and is released in metered quantities into the dopant funnel 216 using the double valve system 208.

The double valve system 208 includes a lower valve 220 and an upper valve 222. The lower valve 220 and the upper valve 222 are both operably connected to a pneumatic actuator 224. A fill chamber 226 is defined between the upper valve 222 and the dopant container 214. The volume of the chamber 226 defines the dopant charge or the amount of dopant released by the dopant feeding device 200 in a single discharge. The pneumatic actuator 224 is configured to vertically reciprocate the lower valve 220 and the upper valve 222 to release metered quantities of dopant from the chamber 226 into the dopant funnel 216 through the lower opening 218 of the dopant container 214. Dopant released into the dopant funnel 216 is dispensed from the dopant feeding device 200 into the feed tube 212 through the outlet 202 defined at the lowermost point of dopant feeding device 200.

The dopant feeding device 200 is described in greater detail in International Patent Application No. PCT/IT2013/000161, which is hereby incorporated by reference in its entirety.

Referring again to FIG. 1, the feed tube 130 includes a first end 132, a second end 134 distal from the first end 132, and an annular sidewall 136 extending along a longitudinal axis of the feed tube 130 from the first end 132 to second end 134. The feed tube 130 has a dopant inlet 138 defined at the first end 132, a dopant outlet 140 (also shown in FIG. 3) defined at the second end 134, and a dopant passage 142 defined therein extending from the dopant inlet 138 to the dopant outlet 140. Solid dopant dispensed from the dopant feeding device 128 is received in the feed tube 130 at the dopant inlet 138, and falls through the dopant passage 142 towards the dopant outlet 140 where the solid dopant is retained until it is melted and released into the melt 110.

In the example embodiment, the feed tube 130 is a telescopic feed tube, including a fixed, inner feed tube 144 and moveable, outer feed tube 146. The inner feed tube 144 is secured in a fixed relationship to one or both of the housing 102 and the dopant feeding device 128, and the outer feed tube 146 is configured to move relative to the inner feed tube 144. The inner feed tube 144 and the outer feed tube 146 are concentrically arranged about a common longitudinal axis, and the outer feed tube 146 is configured to move along the longitudinal axis between an extended position (shown in FIG. 1) and a retracted position (not shown in FIG. 1). The inner feed tube 144 defines the first end 132 and the dopant inlet 138 of the feed tube 130, and the outer feed tube 146 defines the second end 134 and the dopant outlet 140 of the feed tube 130.

The components of the feed tube 130 (e.g., the inner feed tube 144 and the outer feed tube 146) are suitably made of refractory materials that remain substantially chemically inert at elevated temperatures. Suitable materials from which the components of the feed tube 130 may be made of include, for example and without limitation, quartz.

In the example embodiment, the outer feed tube 146 is operatively connected to a linear slide mechanism 148 configured to move the outer feed tube 146 between the extended position (shown in FIG. 1) and the retracted position (not shown in FIG. 1). In some embodiments, the linear slide mechanism 148 is configured to retract the outer feed tube 146 entirely out of the growth chamber 104 when the outer feed tube 146 is in the retracted position. In other embodiments, at least a portion of the outer feed tube 146 is positioned within the growth chamber 104 when the outer feed tube 146 is in the retracted position. The linear slide mechanism 148 may include any suitable device or combination of devices that enable the doping system 114 to function as described herein including, for example and without limitation, tracks, rails, rollers, bearing mechanisms, actuators, and combinations thereof.

In the example embodiment, the linear slide mechanism 148 includes a rail 150, coupling members 152 slidably connected to the rail 150 and attached to the outer feed tube 146, and an actuator (not shown) operably connected to one or both of the outer feed tube 146 and the coupling members 152. The actuator of the linear slide mechanism 148 is configured to move the coupling members 152 along the rail 150, and move the outer feed tube 146 between the extended and retracted positions. In other suitable embodiments, linear actuating devices other than a linear slide mechanism may be used to move the outer feed tube 146 between the extended and retracted positions.

Figure 3:
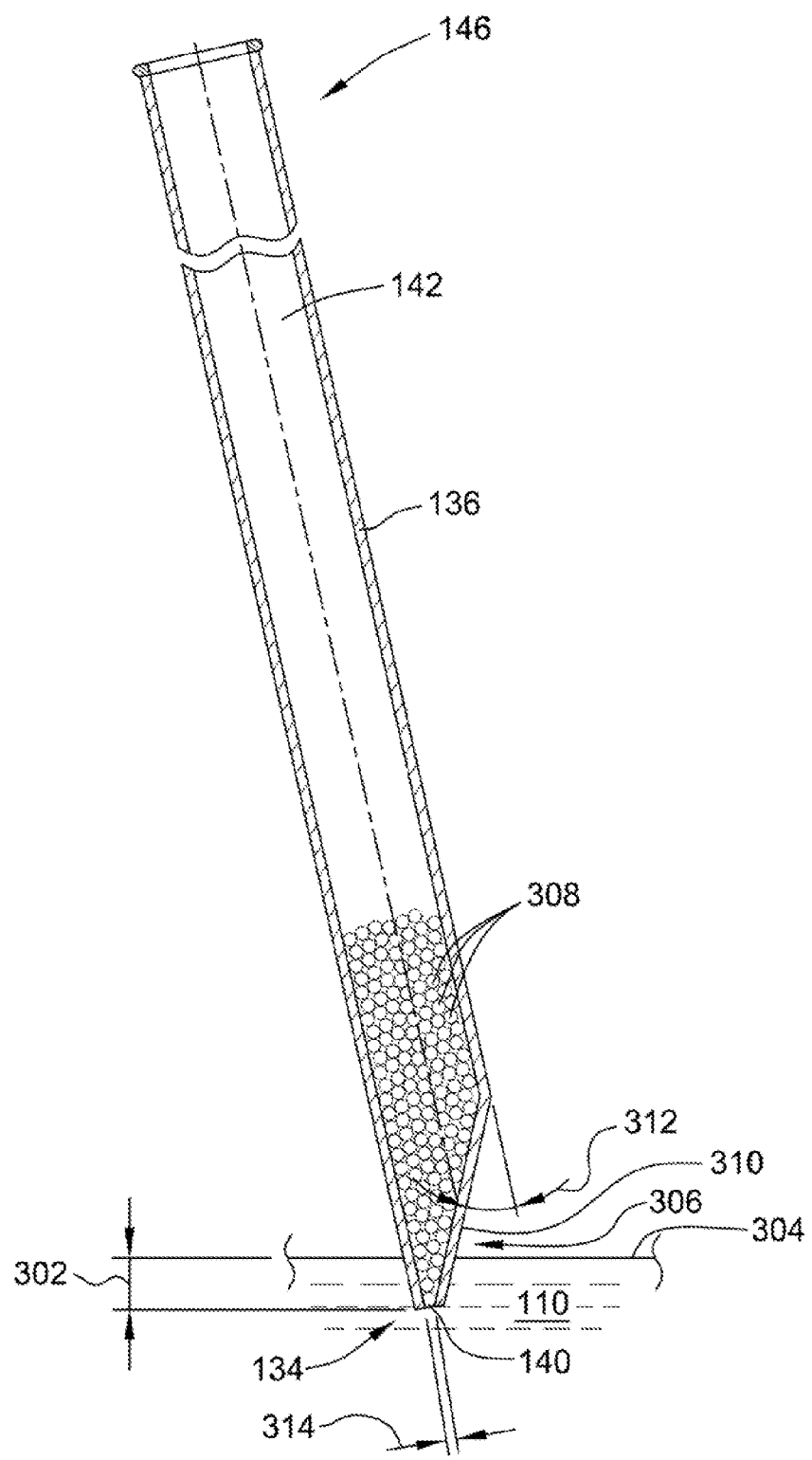
FIG. 3 is an enlarged cross-sectional view of a feed tube of the doping system of FIG. 1.

FIG. 3 is an enlarged cross-sectional view of the feed tube 130, specifically, the outer feed tube 146. When the outer feed tube 146 is in the extended position, as shown in FIG. 3, the dopant outlet 140 is submerged at a depth 302 below a surface 304 of the melt 110. The outer feed tube 146 includes a restrictor nozzle 306 at the second end 134 of the feed tube 130 configured to inhibit solid dopant 308 from passing through the dopant outlet 140 and to allow liquid dopant to pass through the dopant outlet 140.

The restrictor nozzle 306 includes a conical portion 310 extending radially inward from the annular sidewall 136 to the dopant outlet 140 at an angle 312, and defines a diameter 314 of the dopant outlet 140 sized to inhibit solid dopant 308 from passing therethrough. The dopant outlet 140 may have any suitable diameter 314 that enables the doping system 114 to function as described herein, and may vary depending on the type of solid dopant 308 used to dope the melt 110. In some embodiments, for example, the dopant outlet 140 has a diameter of between about 1 millimeter (mm) and about 4 mm, and is configured to receive solid dopant 308 having an average particle size of between about 2 mm and about 5 mm.

In some embodiments, the angle 312 at which the conical portion 310 of the restrictor nozzle 306 extends inward from the sidewall 136 is between about 15° and about 35° and, more suitably, between about 20° and about 30°. In the illustrated embodiment, the conical portion 310 extends inward from the sidewall 136 at an angle of about 25°. Moreover, in the illustrated embodiment, the conical portion 310 of the restrictor nozzle 306 extends inward from the sidewall 136 at an angle 312 such that, when the feed tube 130 is in the extended position, the conical portion 310 and the reminder of the restrictor nozzle 306 are generally oriented at the same angle with respect to the surface of the melt 110, as shown in FIG. 3.

Solid dopant 308 introduced into the feed tube 130 is retained within the dopant passage 142 by the restrictor nozzle 306 at the second end 134 of the feed tube 130 until the solid dopant 308 is melted by heat from the melt 110 and/or the heating elements 112. As the solid dopant melts and forms liquid dopant, the liquid dopant flows out of the feed tube 130 through the dopant outlet 140 and into the melt 110. The shape and orientation of restrictor nozzle 306 and, in particular, the angle 312 at which conical portion 310 extends from the sidewall 136 facilitate dispensing all liquid dopant from within the feed tube 130.

In the example embodiment, the restrictor nozzle 306 is also configured to inhibit liquid melt material from flowing upward into the feed tube 130 through the dopant outlet 140, which can damage or impair operability of the feed tube 130 (e.g., by clogging the dopant outlet 140). In particular, the restrictor nozzle 306 is sized and shaped, and made of suitable materials so that the interfacial surface energy between the melt 110 and the restrictor nozzle 306 and the surface tension of the melt 110 inhibits melt material from flowing upward into the feed tube 130 through the dopant outlet 140. In the example embodiment, the outer feed tube 146 is suitably made of quartz, and has a dopant outlet 140 with a diameter in the range of between about 1 mm and about 4 mm. The outer feed tube 146 is suitable for introducing liquid dopant into the melt 110 at a depth 302 up to about 5 mm. In other embodiments, the outer feed tube 146 may be made of materials other than quartz, such as other refractory materials that remain inert at elevated temperatures, and have a dopant outlet with a diameter less than about 1 mm or greater than about 4 mm.

In use, the crystal growing system 100 is used to grow doped monocrystalline ingots, such as antimony-doped single crystal silicon ingots, from the melt 110. More specifically, the melt 110 is prepared in the crucible 108 by charging the crucible 108 with feedstock material, such as chunk polycrystalline silicon. The feedstock material is melted in the crucible 108 using heating elements 112 to form the melt 110 of semiconductor or solar grade material. Dopants are added the melt 110 using the automatic doping system 114 by dispensing solid dopant from the dopant feeding device 128 into the feed tube 130, melting the solid dopant within the feed tube 130 to form liquid dopant, and introducing the liquid dopant into the melt 110 through the dopant outlet 140 at a depth below the surface of the melt 110. When a desired amount of dopant has been added to the melt 110, a monocrystalline ingot is grown from the melt 110 by contacting the melt 110 with a seed crystal (not shown) to initiate crystal growth, and subsequently pulling the seed crystal away from the melt to grow the monocrystalline ingot.

Figure 4:
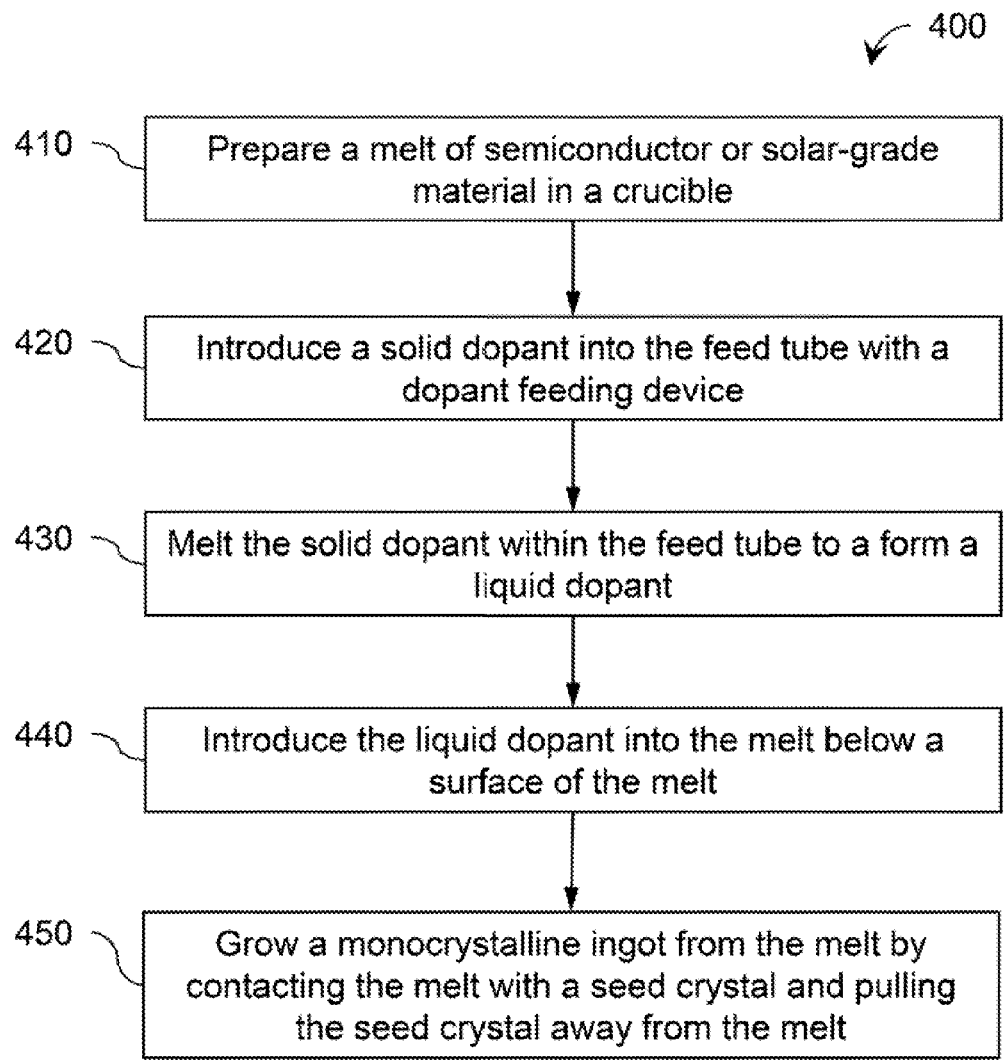
FIG. 4 is a flow chart of an example method of growing a doped monocrystalline ingot using the crystal growing system of FIG. 1.

FIG. 4 is a flow chart of an example method 400 of growing a doped monocrystalline ingot using the crystal growing system 100 described above with reference to FIGS. 1-3. The method 400 generally includes preparing 410 a melt of semiconductor or solar-grade material in the crucible 108 disposed within the growth chamber 104, introducing 420 a solid dopant into the feed tube 130 with the dopant feeding device 128, melting 430 the solid dopant within the feed tube 130 to a form a liquid dopant, introducing 440 the liquid dopant into the melt 110 below the surface 304 of the melt 110, and growing 450 a doped monocrystalline ingot from the melt by contacting the melt with a seed crystal and pulling the seed crystal away from the melt.

The melt 110 may be prepared, for example, by charging the crucible 108 with solid feedstock material and melting the feedstock material with heating elements 112. The semiconductor or solar-grade material used to prepare the melt 110 may include, for example and without limitation, silicon.

The doping system 114 and the method 400 are particularly suitable for use with dopants having a relatively low melting temperature relative to the melting temperature of the semiconductor or solar-grade material used to prepare the melt 110. In some embodiments, for example, the dopant used to dope the melt 110 has a melting temperature less than the melting temperature of the semiconductor or solar-grade material used to prepare the melt. In some particular embodiments, such as when silicon is used to prepare the melt, the dopant used to dope the melt is selected from the group consisting of aluminum, gallium, indium, thallium, and antimony, although any suitable n-type or p-type dopant may be used with the doping system 114 and the method 400.

In some embodiments, the method 400 further includes positioning the dopant outlet 140 of the feed tube 130 at a depth 302 below the surface 304 of the melt 110. In some embodiments, for example, all or part of the feed tube used to carry out the method 400 is moveable between an extended position, in which the feed tube is positioned within the growth chamber 104 and the dopant outlet is positioned below the surface of the melt 110, and a retracted position, in which the feed tube is removed from the growth chamber 104. The dopant outlet may be positioned at any suitable depth below the surface of the melt that enables the doping system 114 to function as described herein. In some embodiments, for example, the dopant outlet is positioned at a depth of at least about 1 cm below the surface of the melt and, more suitably, at a depth of between about 1 cm and about 5 cm below the surface of the melt.

In some embodiments, solid dopant is introduced into the feed tube while the feed tube is in the extended position and is positioned within the growth chamber. In other embodiments, solid dopant is introduced into the feed tube while the feed tube is in the retracted position and removed from the growth chamber, and the feed tube is subsequently moved to the extended position such that solid dopant within the feed tube can be melted by heat from the melt.

In some embodiments, introducing 420 a solid dopant into the feed tube includes introducing multiple charges of solid dopant into the feed tube without removing the feed tube from growth chamber. For example, introducing 420 a solid dopant into the feed tube may include introducing a first charge of solid dopant into the feed tube and, after the first charge of solid dopant is melted and introduced into the melt, introducing a second charge of solid dopant into the feed tube without removing the feed tube from the growth chamber.

In some embodiments, introducing 440 the liquid dopant into the melt includes introducing the liquid dopant into the melt while the monocrystalline ingot is being grown. In some embodiments, for example, the feed tube 130 is held in the extended position after crystal growth is initiated, and liquid dopant is intermittently or continuously introduced into the melt 110 while the monocrystalline ingot is grown. Thus, the method 400 can be used to dope a melt in a batch CZ process or in a continuous CZ process.

Embodiments of the doping systems and methods described herein provide several advantages over known doping systems and methods. For example, the doping systems and methods described herein introduce dopants in liquid form below a surface of a melt of semiconductor or solar-grade material. By introducing dopants in liquid form, the doping systems and methods of the present application facilitate inhibiting thermal shock and freezing of melt material, which can result in loss of crystal structure of a growing monocrystalline ingot. Moreover, by introducing dopants as a liquid below the surface of a melt, the doping systems and methods of the present application facilitate reducing evaporation of elemental dopant and dopant compounds (e.g., dopant oxide species) that might otherwise deposit on view ports on a crystal growing system and inhibit an operator's ability to monitor a crystal growing operation. In addition, introducing dopants as a liquid below the surface of a melt inhibits splashing of the melt, which might otherwise cause crystal defects or damage to components of the crystal growing system.

The doping systems and methods of the present application thus facilitate doping semiconductor or solar-grade melts with low temperature dopants, such as aluminum, gallium, indium, thallium, and antimony, while alleviating many of the problems associated with using low temperature dopants to dope semiconductor or solar-grade melts.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

The invention claimed is:

1. A method of growing a doped monocrystalline ingot using a crystal growing system including a growth chamber, a dopant feeder, and a feed tube, the method comprising:
   preparing a melt of semiconductor or solar-grade material in a crucible disposed within the growth chamber;
   introducing a solid dopant into the feed tube with the dopant feeder;
   melting the solid dopant within the feed tube to a form a liquid dopant;
   introducing the liquid dopant into the melt below a surface of the melt; and
   growing a monocrystalline ingot from the melt by contacting the melt with a seed crystal and pulling the seed crystal away from the melt.

2. The method of claim 1, wherein the feed tube includes a first end defining an inlet for receiving solid dopant from the dopant feeder and a second end having a dopant outlet defined therein, the method further comprising positioning the dopant outlet below the surface of the melt.

3. The method of claim 2, wherein positioning the dopant outlet below the surface of the melt includes positioning the dopant outlet at a depth of at least 1 cm below the surface of the melt.

4. The method of claim 2, wherein positioning the dopant outlet below the surface of the melt includes positioning the dopant outlet at a depth of between 1 cm and 5 cm below the surface of the melt.

5. The method of claim 1, wherein introducing a solid dopant into the feed tube includes introducing the solid dopant into the feed tube while the feed tube is positioned within the growth chamber.

6. The method of claim 1, wherein introducing a solid dopant into the feed tube includes introducing a first charge of solid dopant into the feed tube and, after the first charge of solid dopant is melted, introducing a second charge of solid dopant into the feed tube without removing the feed tube from the growth chamber.

7. The method of claim 1, wherein introducing a solid dopant into the feed tube includes introducing the solid dopant into the feed tube while the feed tube is removed from the growth chamber.

8. The method of claim 1, wherein introducing the liquid dopant into the melt includes introducing the liquid dopant into the melt while the monocrystalline ingot is being grown.

9. The method of claim 1, wherein introducing the liquid dopant into the melt includes introducing the liquid dopant into the melt at a depth of between 1 cm and 5 cm below a surface of the melt.

10. The method of claim 1, wherein the solid dopant is selected from the group consisting of aluminum, gallium, indium, thallium, and antimony.

11. The method of claim 1, wherein the melt is a silicon melt.

* * * * *